US012787797B2

(12) United States Patent
Levy et al.

(10) Patent No.: US 12,787,797 B2

(45) Date of Patent: Nov. 3, 2026

(54) FACILITATING FORMATION OF A VIA IN A SUBSTRATE

(71) Applicant: MOSAIC MICROSYSTEMS LLC, Rochester, NY (US)

(72) Inventors: David Howard Levy, Rochester, NY (US); Shelby Forrester Nelson, Pittsford, NY (US)

(73) Assignee: MOSAIC MICROSYSTEMS LLC, Rochester, NY (US)

(*) Notice: Subject to any disclaimer, the term of this patent is extended or adjusted under 35 U.S.C. 154(b) by 367 days.

(21) Appl. No.: 18/383,231

(22) Filed: Oct. 24, 2023

(65) Prior Publication Data

US 2024/0071779 A1 Feb. 29, 2024

Related U.S. Application Data

(63) Continuation of application No. PCT/US2022/025924, filed on Apr. 22, 2022.

(60) Provisional application No. 63/180,953, filed on Apr. 28, 2021.

(51) Int. Cl.

| | |
|---|---|
| ***H10W 70/05*** | (2026.01) |
| ***C03C 23/00*** | (2006.01) |
| ***H10P 50/00*** | (2026.01) |
| ***H10W 70/63*** | (2026.01) |
| ***H10W 70/692*** | (2026.01) |

(52) U.S. Cl.

CPC ....... *H10W 70/095* (2026.01); *C03C 23/0025* (2013.01); *H10P 50/73* (2026.01); *H10W 70/635* (2026.01); *H10W 70/692* (2026.01)

(58) Field of Classification Search

None

See application file for complete search history.

(56) References Cited

U.S. PATENT DOCUMENTS

| | | | |
|---|---|---|---|
| 5,763,903 | A | 6/1998 | Mandai |
| 10,134,657 | B2 | 11/2018 | Levesque, Jr. |
| 10,201,867 | B2 | 2/2019 | Ono |

(Continued)

FOREIGN PATENT DOCUMENTS

| | | | | |
|---|---|---|---|---|
| WO | 2018217696 A2 | | 11/2018 | |
| WO | WO-2021050514 A1 | * | 3/2021 | ......... H01L 23/5384 |

OTHER PUBLICATIONS

Notice of Allowance issued in U.S. Appl. No. 17/723,701, mailed Jan. 2, 2025.

(Continued)

*Primary Examiner* — Duy Vu N Deo

*Assistant Examiner* — Andrew Keelan Laobak

(74) *Attorney, Agent, or Firm* — ROSSI, KIMMS & McDOWELL LLP

(57) ABSTRACT

A method of facilitating formation of a via in an inorganic substrate may include applying a single-sided acidic wet etching process to a first surface of the inorganic substrate in a first state in which the inorganic substrate has a mask layer set covering a second surface of the inorganic substrate; and applying a double-sided acidic wet etching process to the first surface and the second surface of the inorganic substrate after completion of the single-sided acidic wet etching process and in a second state in which the inorganic substrate has had the mask layer set removed from the second surface of the inorganic substrate.

16 Claims, 7 Drawing Sheets

(56) References Cited

U.S. PATENT DOCUMENTS

| | | | |
|---|---|---|---|
| 10,292,275 | B2 | 5/2019 | Isobe |
| 10,470,300 | B1 | 11/2019 | Seki et al. |
| 2012/0045611 | A1 | 2/2012 | Shih |
| 2012/0315739 | A1 | 12/2012 | Hashii |
| 2013/0034687 | A1 | 2/2013 | Koike et al. |
| 2013/0037922 | A1* | 2/2013 | Arriagada ........... H01L 21/2007 438/455 |
| 2013/0075739 | A1 | 3/2013 | Loy |
| 2015/0060402 | A1 | 3/2015 | Burkett |
| 2016/0069379 | A1 | 3/2016 | Bae |
| 2017/0036419 | A1 | 2/2017 | Adib |
| 2018/0005922 | A1 | 1/2018 | Levesque, Jr. |
| 2018/0047630 | A1 | 2/2018 | Kato et al. |
| 2018/0294209 | A1 | 10/2018 | Yoon |
| 2018/0317319 | A1 | 11/2018 | Mori et al. |
| 2018/0342450 | A1 | 11/2018 | Huang et al. |
| 2018/0342451 | A1 | 11/2018 | Dahlberg |
| 2019/0109034 | A1 | 4/2019 | Fehkuhrer |
| 2019/0185373 | A1 | 6/2019 | Hu |
| 2019/0256404 | A1* | 8/2019 | Gross ...................... C03C 15/02 |
| 2019/0312067 | A1 | 10/2019 | Garner et al. |
| 2020/0354262 | A1* | 11/2020 | Guo ........................ C03C 3/093 |
| 2020/0354267 | A1 | 11/2020 | Cai et al. |
| 2022/0246421 | A1 | 8/2022 | Nelson et al. |
| 2022/0270892 | A1 | 8/2022 | Nelson et al. |
| 2025/0273479 | A1 | 8/2025 | Nelson et al. |

OTHER PUBLICATIONS

Communication under Rule 71(3) EPC issued in European Appln. No. 20884706.1 mailed Oct. 28, 2024.

Notice of Allowance issued in U.S. Appl. No. 17/724,068 mailed Apr. 16, 2024.

Ostholt. “High speed through glass via manufacturing technology for interposer.” Proceedings of the 5th Electronics System-integration Technology Conference (ESTC). IEEE, 2014. Cited in specification.

Gillis. “Double-Cantilever Cleavage Mode of Crack Propagation”, Journal of Applied Physics. 1964: 647-658. vol. 35, No. 3. Cited in Specification.

International Search Report issued in Intl. Appln. No. PCT/US2020/059407 mailed Mar. 18, 2021.

Written Opinion issued in Intl. Appln. No. PCT/US2020/059407 mailed Mar. 18, 2021.

International Preliminary Report on Patentability issued in Intl. Appln. No. PCT/US2020/059407 mailed Nov. 4, 2021.

International Search Report issued in Intl. Appln. No. PCT/US2020/059387 mailed Feb. 4, 2021.

Written Opinion issued in Intl. Appln. No. PCT/US2020/059387 mailed Feb. 4, 2021.

International Search Report issued in Intl. Appln. No. PCT/US2022/025924 mailed Jul. 28, 2022.

Written Opinion issued in Intl. Appln. No. PCT/US2022/025924 mailed Jul. 28, 2022.

“Borosilicate glass”, Wikipedia. 2012, Retrieved from the Internet on Jun. 17, 2022. < https://en.wikipedia.org/wiki/Borosilicate_glass> Cited in NPL 8.

International Preliminary Report on Patentability issued in Intl. Appln. No. PCT/US2022/025924 mailed Aug. 31, 2023.

1 Extended European Search Report issued in European Appln. No. 20884706.1, mailed Nov. 8, 2023.

Office Action issued in U.S. Appl. No. 17/723,701, mailed Aug. 30, 2024.

* cited by examiner

FACILITATING FORMATION OF A VIA IN A SUBSTRATE

CROSS-REFERENCE TO RELATED APPLICATIONS

This application is a continuation of prior PCT International Appln. No. PCT/US2022/025924, filed Apr. 22, 2022, which claims the benefit of U.S. Provisional Application No. 63/180,953, filed Apr. 28, 2021, the entire disclosure of each of these applications is hereby incorporated herein by reference.

STATEMENT OF GOVERNMENT INTEREST

This invention was made with government support under 1951114 awarded by the National Science Foundation. The government has certain rights in the invention.

TECHNICAL FIELD

Aspects of this disclosure generally are related to the formation of one or more vias in a substrate, such as an inorganic substrate, which may be glass or a multicomponent glass substrate.

BACKGROUND

Insulating substrates with precisely formed and positioned through-holes, or vias, have many applications in electronic and photonic packaging. A through-substrate via can be filled with conductive material to provide a vertical electrical connection that passes completely through the substrate. A via may be a hole through the substrate that is large enough to fill with conductive material, in order to conduct electrical signals from one surface of the substrate to the other. Glass has many advantages as a substrate, including that it can be formed in large sheets of uniform thickness with very smooth surfaces, is dimensionally stable, and relatively rigid. Glass can be formed with those good properties at thicknesses well below 0.5 mm.

The through-holes to be filled with conductive material can be formed by a variety of methods, including lithography of photolithographic glass, sand-blasting, electric discharge drilling, swift heavy ion tracks, and many versions of laser drilling. In some cases, the holes are formed to the correct opening size directly. In others, the positions of the vias are established by a method which creates a damage track or preformed opening or pilot hole in the glass, while a subsequent wet etching process enlarges the damage track to create a through-hole with the desired diameter. When processing a material, such as glass, the details of the via formation typically have to be carefully designed to create smooth, circular, vias of the correct opening diameter with low cracking around the holes. Furthermore, speed of sample throughput and capital costs for the manufacturing equipment are important parameters for a manufacturing process. See, Ostholt, Roman, et al. "High speed through glass via manufacturing technology for interposer." Proceedings of the 5th Electronics System-integration Technology Conference (ESTC). IEEE, 2014. Such considerations have directed considerable attention to approaches that involve first the creation of the above-mentioned damage track/pilot hole, and then a subsequent wet-etch to enlarge the hole.

In this regard, FIGS. 1A-1C illustrate a conventional via formation process, where, as shown in FIG. 1A, a single-sided wet-etching process is applied to a first surface 400*a* of a glass substrate 400 having a damage track 40 formed therein to create a via 45 (FIG. 1B). To protect the second surface 400*b* from the wet-etching process, a sealant material layer 450 is applied to the second surface 400*b*.

When substrate 400 is immersed in etch solution, the etch will begin at the exposed surface 400*a* and progress so that the largest diameter of the via 45 is at the top first surface 400*a*, represented by opening 45*a* of via 45 in FIG. 1B. Once the via 45 is etched through to the sealed second surface 400*b*, as shown in FIG. 1B, the etching must continue to be applied further to enlarge the opening 45*b* in FIG. 1B on the sealed second surface 400*b* to the desired diameter, 20*tb* shown in FIG. 1C. This added duration of the wet etch means that the top diameter 20*ra* in FIG. 1B also continues to grow to a potentially undesired diameter 20*ta* as shown in FIG. 1C, resulting in an excessively tapered through-hole. In this regard, the present inventors recognized that one potential difficulty of this single-sided wet etching process is that the final diameter of the top opening of the via 45 in the exposed first surface 400*a* is dependent on the thickness 410 of the substrate 400 and the desired diameter of the bottom opening of the via 45 in the sealed second surface 400*b*. Thus, the density of vias in the substrate 400 is limited by this conventional single-sided wet etching process due to the relatively large size of the via openings (e.g., opening 45*a*) in the exposed first surface 400*a* of the substrate 400, and the achievable size of via 45 is tied directly to and possibly limited by the thickness 410 of the substrate 400.

Another difficulty frequently encountered in this single-sided wet etching process recognized by the present inventors is that wet etching can readily occur along the interface 46 (FIG. 1C) between the sealant material layer 450 and the second surface 400*b* of the substrate 400, once the hole through the substrate 400 allows the etchant to reach that interface 46. This situation causes lateral etching along the interface 46, causing an undercutting or laterally-etched region 47 (FIG. 1C), referred to also as a footer, that grows with time during the etching. The laterally-etched region 47 can achieve a diameter 59 considerably larger than the diameter 20*ta* of the opening 45*a* at the surface 400*a*. As shown in FIG. 1C, the diameter 20*ta* of the top opening 45*a* of the via 45 is much smaller than the diameter 59 of the laterally-etched region 47. The present inventors recognized that the presence of such a large undercut or laterally-etched region 47 is not preferred and can be harmful to performance.

Accordingly, the present inventors recognized that the conventional solely single-sided wet etching process of FIGS. 1A-1C is less preferable due at least to the presence of the large undercutting or laterally-etched region 47 and the relatively large diameter 20*ta* exhibited by the opening 45*a* in the exposed first surface 400*a* of the substrate 400, which limits via density. The present inventors also recognized that a lack of control exists over opening diameter 20*ta*, which is dependent on the thickness 410 of the substrate 400.

Therefore, the present inventors recognized that a need in the art exists for improved via formation.

SUMMARY

At least the above-discussed need is addressed and technical solutions are achieved in the art by various embodiments of the present invention. In some embodiments, a method of facilitating formation of a via in an inorganic substrate may include applying a single-sided acidic wet etching process to a first surface of the inorganic substrate in a first state in which the inorganic substrate has a mask layer set covering a second surface of the inorganic substrate. The inorganic substrate may include a damage track having a first end in the first surface of the inorganic substrate and a second end in the second surface of the inorganic substrate, the second surface on an opposite side of the inorganic substrate than the first surface of the inorganic substrate. The single-sided acidic wet etching process may enlarge at least a maximum width of the first end of the damage track to form a first opening in the first surface of the inorganic substrate. The method may also include applying a double-sided acidic wet etching process to the first surface and the second surface of the inorganic substrate after completion of the single-sided acidic wet etching process and in a second state in which the inorganic substrate has had the mask layer set removed from the second surface of the inorganic substrate. The double-sided acidic wet etching process may enlarge at least a maximum width of the first opening in the first surface of the inorganic substrate to form a second opening in the first surface of the inorganic substrate. The double-sided acidic wet etching process may result in an opening in the second surface of the inorganic substrate, the opening in the second surface of the inorganic substrate having a maximum width that is less than a maximum width of the second opening in the first surface of the inorganic substrate. The double-sided acidic wet etching process may also result in a via extending from the second opening in the first surface of the inorganic substrate to the opening in the second surface of the inorganic substrate. The via may have no waist or a waist within a range of 5% to 40% of a thickness of the inorganic substrate from the second surface of the inorganic substrate.

In some embodiments, each of the single-sided acidic wet etching process and the double-sided acidic wet etching process includes application of an etching composition comprising hydrogen fluoride ("HF").

In some embodiments, the inorganic substrate is a multicomponent glass substrate. In some embodiments, each of the single-sided acidic wet etching process and the double-sided acidic wet etching process includes application of an etching composition including a hydrogen fluoride ("HF") concentration less than 1M and a strong acid concentration greater than 0.8M.

In some embodiments, the double-sided acidic wet etching process results in the opening in the second surface of the inorganic substrate having no footer or a footer having a maximum width less than 140% of the maximum width of the opening in the second surface of the inorganic substrate.

In some embodiments, the via comprises the waist within 5% to 40% of the thickness of the inorganic substrate from the second surface of the inorganic substrate, and the waist of the via has a width within 75% to 100% of the maximum width of the opening in the second surface of the inorganic substrate.

In some embodiments, the method further includes bonding a handle or carrier substrate to the second surface of the inorganic substrate after completion of the double-sided acidic wet etching process. In some embodiments, the handle or carrier substrate is an inorganic substrate such as glass. In some embodiments, such a glass handle substrate may be pure silicon dioxide, such as fused silica, or may be a multicomponent glass containing or including silicon dioxide and other elements. In some embodiments, the handle or carrier substrate is a semiconductor. In some embodiments, the handle substrate is silicon.

In some embodiments, the via has a conical frustrum shape.

In some embodiments, the damage track was formed by a laser.

In some embodiments, a ratio of (a) a diameter of the second opening in the first surface of the inorganic substrate to (b) a diameter of the opening in the second surface of the inorganic substrate is in a range of 40% to 95%, and the diameter of the second opening in the first surface of the inorganic substrate and the diameter of the opening in the second surface of the inorganic substrate are measured along parallel line segments.

In some embodiments, prior to applying the single-sided acidic wet etching process, a thickness of the inorganic substrate is between 300 micrometers and 10 micrometers. In some embodiments, after completion of the single-sided acidic wet etching process and prior to applying the double-sided acidic wet etching process, a thickness of the inorganic substrate is between 300 micrometers and 10 micrometers.

It should be noted that various embodiments of the present invention include variations of the methods or processes summarized above or otherwise described herein (which should be deemed to include the figures) and, accordingly, are not limited to the actions described or shown in the figures or their ordering, and not all actions shown or described are required according to various embodiments. According to various embodiments, such methods may include more or fewer actions and different orderings of actions. Any of the features of all or part of any one or more of the methods or processes summarized above or otherwise described herein may be combined with any of the other features of all or part of any one or more of the methods or processes summarized above or otherwise described herein.

Further, any of all or part of one or more of the methods or processes and associated features thereof discussed herein may be implemented or executed on or by all or part of a device system, apparatus, or machine, such as all or a part of any of one or more of the systems, apparatuses, or machines described herein or a combination or sub-combination thereof.

BRIEF DESCRIPTION OF THE DRAWINGS

It is to be understood that the attached drawings are for purposes of illustrating aspects of various embodiments and may include elements that are not to scale.

DETAILED DESCRIPTION

At least some embodiments of the present invention improve upon at least the above-discussed conventional solely-single-sided etching process for via formation. In some embodiments of the present invention, an improved single-sided etching process (SSEP) may be applied to an inorganic substrate that includes a damage or pilot track, and that includes a mask layer set covering one surface (e.g., "a second surface" or a "bottom surface") of the substrate, followed by an improved double-sided etching process ("DSEP") applied to the substrate with the mask layer set removed. The SSEP provides an initial opening at one end of each damage track, each initial opening with a top-surface diameter smaller than the target final opening diameter, and may provide a pathway or interim via with a tapered profile. The masked or sealed 'bottom' or second surface or side of the substrate may then be unsealed by removal of the mask layer set, the mask layer set including one or more mask layers. Then, the improved DSEP is applied to both surfaces or sides of the substrate, according to some embodiments of the present invention. The DSEP may enlarge the top-surface diameter of each pathway or interim via to the target final diameter and may open the bottom-surface diameter of each pathway or interim via, providing a resulting respective via with a conical frustum or trumpet shape, according to some embodiments.

Figure 1A:
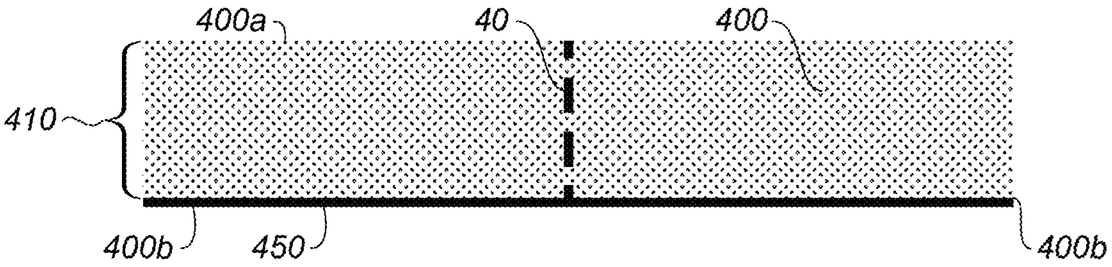
FIG. 1A (PRIOR ART)
FIGS. 1A-1C illustrate a conventional single-sided etching process.
Figure 1B:
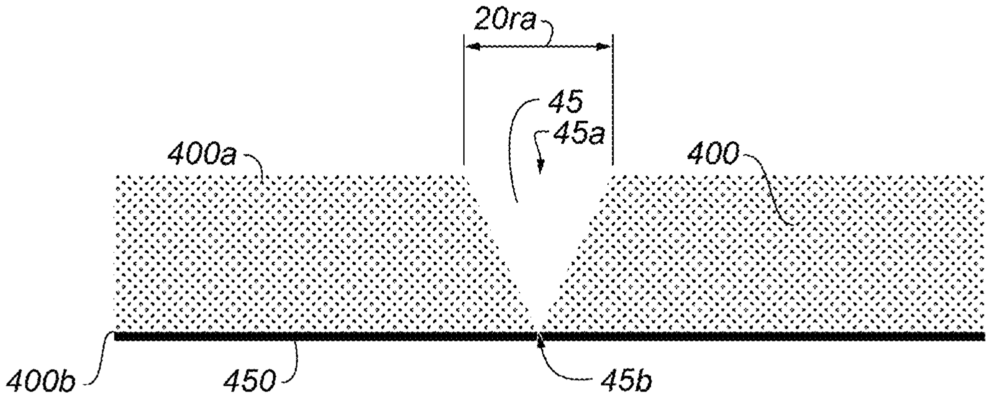
FIG. 1B (PRIOR ART)
Figure 1C:
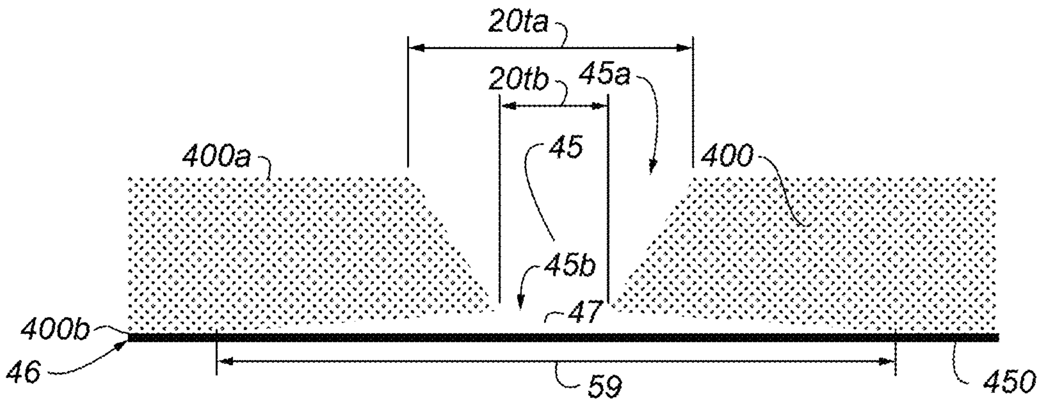
FIG. 1C (PRIOR ART)

The SSEP and DSEP according to various embodiments of the present invention provide increased control over the shape of the via, while maintaining ease of metallization of the via, since the mostly tapered shape of the resultant via avoids air pockets or other voids during metallization, e.g., by electroplating. In this regard, the ratio of the diameter of the 'top' opening of the via to the 'bottom' opening is closer to unity than the conventional solely single-sided etch described above with respect to FIGS. 1A-1C, further providing, in part, the improved via shape as compared to the conventional solely single-sided etch described above with respect to FIGS. 1A-1C. Further still, application of the SSEP followed by the DSEP provides greater control over the diameter of the 'top' opening of the via at least by making the diameter of the 'top' opening less dependent on the thickness of the substrate, allowing the option for a reduced diameter of the 'top' opening of the via and greater via density in the substrate as compared to the conventional solely single-sided etch via formation process above with respect to FIGS. 1A-1C.

Further, the SSEP can be applied for a shorter duration than the conventional solely single-sided etch described above with respect to FIGS. 1A-1C, since the DSEP provides additional opening of both ends of each via, and therefore, the SSEP is not necessarily responsible for having to enlarge the farther end of the via to the desired diameter, as in the conventional solely single-sided etch described above with respect to FIGS. 1A-1C. The shorter duration of the SSEP means that the resulting undercutting, or lateral etching that may occur at the interface between the multi-component glass and the masking layer set will therefore be reduced compared to that which may be produced by the solely single-sided etch described above with respect to FIGS. 1A-1C. Further, the DSEP etch enlarges the diameter of the "bottom" opening enough that any undercutting or footer that may have been created during the SSEP will be etched either completely away, or substantially reduced, which provides, at least in part, the improved via shape as compared to the conventional solely single-sided etch described above with respect to FIGS. 1A-1C.

The etch chemistry of the DSEP may be chosen to be the same as that of the SSEP for process simplicity, according to some embodiments. It should be noted, however, that the invention is not limited to these or any other examples or embodiments provided herein, which are referred to for purposes of illustration only.

In the descriptions herein, certain specific details are set forth in order to provide a thorough understanding of various embodiments of the invention. However, one skilled in the art will understand that the invention may be practiced at a more general level without one or more of these details. In other instances, well-known structures have not been shown or described in detail to avoid unnecessarily obscuring descriptions of various embodiments of the invention.

Any reference throughout this specification to "one embodiment", "an embodiment", "an example embodiment", "an illustrated embodiment", "a particular embodiment", and the like means that a particular feature, structure or characteristic described in connection with the embodiment is included in at least one embodiment. Thus, any appearance of the phrase "in one embodiment", "in an embodiment", "in an example embodiment", "in this illustrated embodiment", "in this particular embodiment", or the like in this specification is not necessarily all referring to one embodiment or a same embodiment. Furthermore, the particular features, structures or characteristics of different embodiments may be combined in any suitable manner to form one or more other embodiments.

Unless otherwise explicitly noted or required by context, the word "or" is used in this disclosure in a non-exclusive sense. In addition, unless otherwise explicitly noted or required by context, the word "set" is intended to mean one or more. For example, the phrase, "a set of objects" means one or more of the objects.

Further, the phrase "at least" is or may be used herein at times merely to emphasize the possibility that other elements may exist besides those explicitly listed. However, unless otherwise explicitly noted (such as by the use of the term "only") or required by context, non-usage herein of the phrase "at least" nonetheless includes the possibility that other elements may exist besides those explicitly listed. For example, the phrase, 'based at least on A' includes A as well as the possibility of one or more other additional elements besides A. In the same manner, the phrase, 'based on A' includes A, as well as the possibility of one or more other additional elements besides A. However, the phrase, 'based only on A' includes only A. Similarly, the phrase 'configured at least to A' includes a configuration to perform A, as well as the possibility of one or more other additional actions besides A. In the same manner, the phrase 'configured to A' includes a configuration to perform A, as well as the possibility of one or more other additional actions besides A. However, the phrase, 'configured only to A' means a configuration to perform only A.

Further, the phrase "in response to" may be used in this disclosure. For example, this phrase may be used in the following context, where an event A occurs in response to the occurrence of an event B. In this regard, such phrase includes, for example, that at least the occurrence of the event B causes or triggers the event A.

Figure 2:
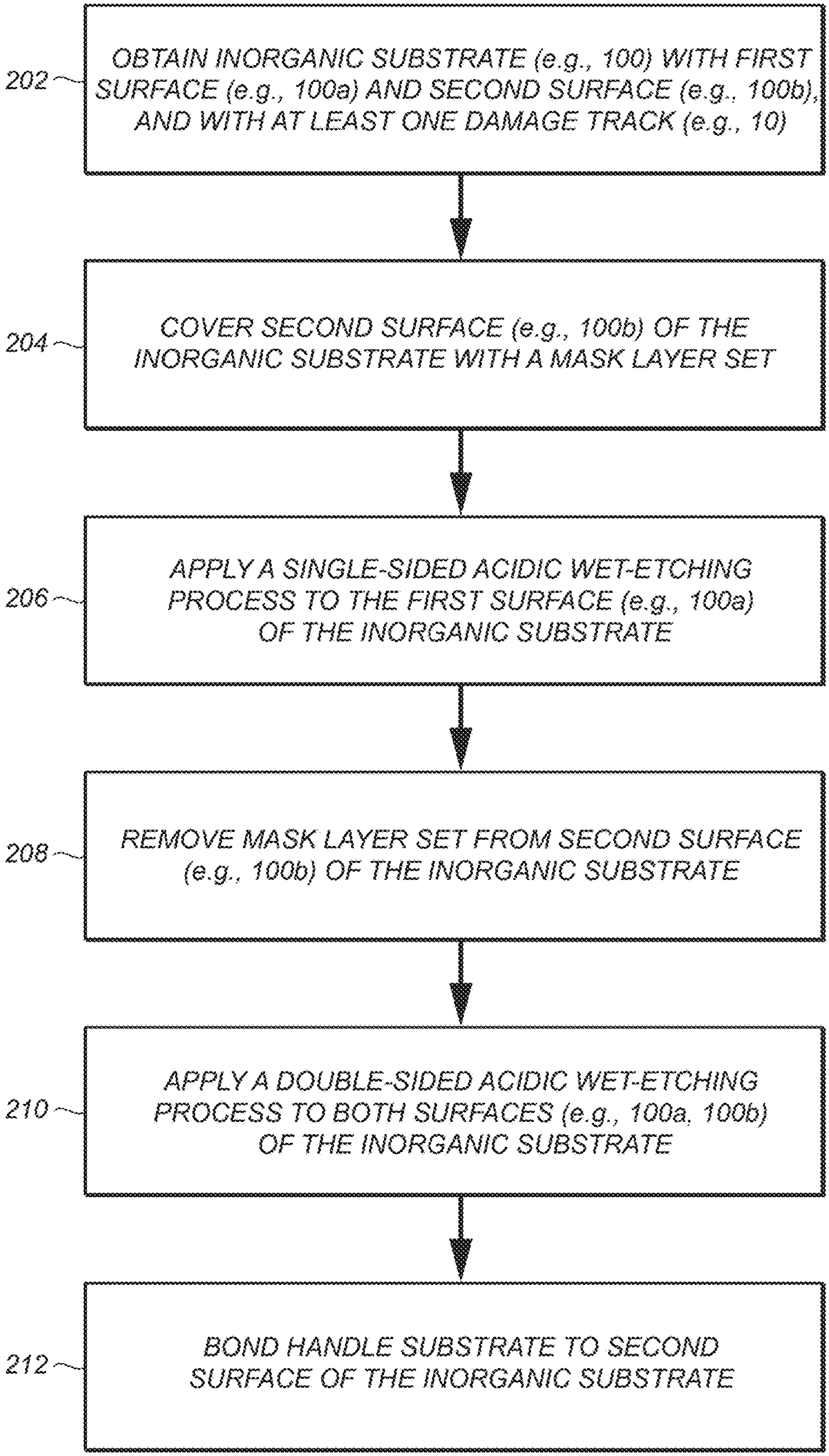
FIG. 2 illustrates methods of facilitating formation of a via in a substrate, according to some embodiments of the present invention.

FIG. 2 illustrates methods of facilitating formation of a via in a substrate, according to some embodiments of the present invention. In some embodiments, the substrate is an inorganic substrate, and, in some embodiments, the substrate is a multicomponent glass substrate. Although FIG. 2 includes block 202, block 204, block 206, block 208, block 210, and block 212 in an illustrated sequence, each block corresponding to respective actions, various embodiments of the present invention include a subset (one or more) of such blocks in same or different sequences (when more than two blocks are included). It should be noted that each block in FIG. 2 may be considered a method step, according to some embodiments. Further, various embodiments of the present invention are not limited to one, or more, or all of the actions shown in the blocks of FIG. 2. For example, a method according to some embodiments may require the performance of block 206 and block 210 under the control of one entity, whereas the actions of one or more of the other blocks need not occur or may occur under the control of another entity (or the same entity, in some embodiments). Some embodiments of the present invention include other actions described herein not shown in FIG. 2 in addition to or in lieu of the actions shown in FIG. 2. In this regard, FIG. 2 is provided merely for illustration purposes and is not limiting. Referring to the process flow chart in FIG. 2, block 202 may include, according to some embodiments, obtaining an inorganic substrate, including damage or pilot tracks (or pilot holes) at specified locations through the substrate where vias are desired. (For ease of discussion going forward, the phrase "damage track" will be intended to include a damage track, a pilot track, or a pilot hole, according to various respective embodiments). In some embodiments, block 202 may include forming one or more damage tracks in the inorganic substrate, for example, by a laser in some embodiments.

Figure 3A:
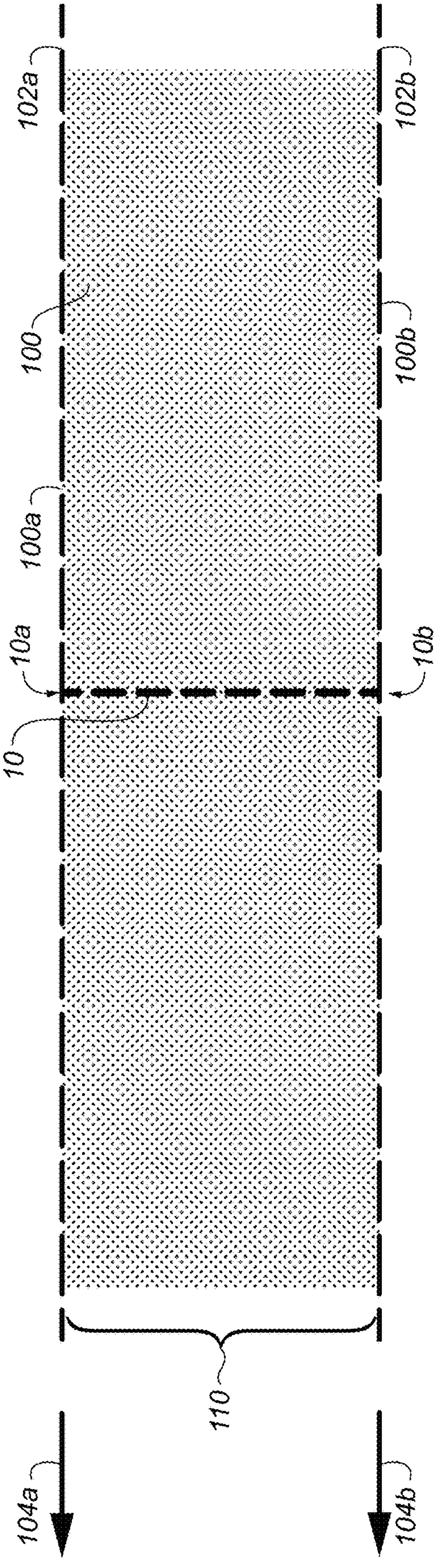
FIGS. 3A-3B illustrate an example of a substrate including a damage or pilot track with reference to block 202 in FIG. 2, according to some embodiments of the present invention, with and without a blocking or masking layer applied to the second side of the substrate according to block 204 in FIG. 2, according to some embodiments of the present invention.

FIG. 3A illustrates a damage track 10 (illustrated in bold broken line) proceeding all the way through the thickness 110 of an inorganic substrate 100, according to some embodiments. The damage track 10 may include a first end 10*a* in a first surface 100*a* of the inorganic substrate 100 and a second end 10*b* in a second surface 100*b* of the inorganic substrate 100. The inorganic substrate 100 may be any inorganic material, useful for semiconductor, photonic, electronic or photonic packaging, that allows the formation of a damage track, according to some embodiments. Inorganic substrates may include, but are not limited to, glass, fused silica, synthetic quartz, glass ceramic, ceramic, aluminum oxides, crystalline material, such as sapphire, or laminated layers of such materials (for example, coated glass). Silicon dioxide ($SiO_2$)-based materials may be particularly suitable in some contexts. $SiO_2$ as an amorphous material that can be suitably disrupted by laser energy and is particularly well suited to some embodiments of the present invention since application of laser energy leads to damage regions that have a substantially higher etch rate than neighboring undamaged regions. Furthermore, $SiO_2$ can be etched with wet processes that exploit this difference between damaged and undamaged regions which provides very well controlled etch rates that retain a very high degree of surface smoothness. $SiO_2$ may be pure, commonly referred to as fused silica or fused quartz, or may contain other components including but not limited to Al, Ca, B, and Mg, according to some embodiments. $SiO_2$ containing other components may be known as multicomponent glass. In this regard, the inorganic substrate 100 may be a multicomponent glass substrate, in some embodiments.

The inorganic substrate thickness 110 may be any value, but preferably under 500 micrometers in some embodiments, and more preferably in some embodiments, between 300 micrometers and 10 micrometers, or between 200 micrometers and 10 micrometers in some embodiments. In some embodiments, such thickness values or ranges of the inorganic substrate 100 are satisfied at least (e.g., immediately) prior to (a) applying the single-side etching process discussed in more detail below with respect to block 206 in FIG. 2, (b) applying the double-side etching process discussed in more detail below with respect to block 210 in FIG. 2, or after application of both (a) and (b). The inorganic substrate 100 may be in the form of a wafer, or in the form of a panel, according to some embodiments. The dimensions of the inorganic substrate 100 may conform to the standard sizes used for semiconductor wafers, or may be different. The inorganic substrate 100, if in the form of a wafer, may include the flats or notches typical for semiconductor wafers, or may be perfectly round. The inorganic substrate 100, if in the form of a glass panel, may be any desired size up to the width practical for forming the glass, according to some embodiments.

Inorganic substrates may be made by several processes, according to some embodiments, including fusion processes, melt-grown processes, and crystal-growth processes. Although the inorganic substrate 100 shown, for example, by FIG. 3 contains a single damage track 10 at a specific desired location of a via in the inorganic substrate 100, typically, the inorganic substrate 100 will contain a plurality of damage tracks, at desired via locations. A damage track, including the damage track 10, may be produced by any suitable process, such as the application of high-energy particles or a laser drilling process. For reasons of high through-put, each damage-track may be produced by a laser designed to create a large number of damage tracks in the inorganic substrate 100. Each damage track may be created with a single laser shot. Alternatively, each laser damage track may be produced with a plurality of laser pulses that are directed at the same region of the substrate. According to some embodiments, a preferred process in some contexts is a laser process that produces well-formed damage tracks, without producing cracks in the surrounding inorganic substrate material. In some embodiments, particularly preferable processes are those that use a short laser pulse (e.g., from 0.1 nanosecond (1e-10) to 1 femtosecond (1e-15)) with an optical system that creates a line focus system to form damage tracks through the inorganic substrate 100. A damage track, according to some embodiments, is assumed to be produced in a line through the entire thickness 110 of the inorganic substrate 100. In some embodiments, the damage track 10 may be a small (diameter less than or equal to 1 micrometer) hole through the inorganic substrate 100. In other embodiments, the damage track 10 may have portions of its length that are open, but portions that are filled with substrate material with a modified atomic arrangement relative to the bulk of the substrate. The laser beam may have a beam direction which is the main direction of propagation of the beam. In some embodiments, this direction may be perpendicular to the surfaces 100*a* or 100*b* of the substrate 100. In some embodiments, the laser beam is circular or substantially circular in cross section taken perpendicular to the direction of beam travel. In other embodiments, the beam may exhibit a deviation from circularity in cross section taken perpendicular to the direction of beam travel. The deviation from circularity may occur from the beam having a shape in cross section taken perpendicular to the direction of beam travel that is not or substantially not circularly symmetric, including but not limited to a shape in cross section that is an ellipse, a line, or containing two or more regions of high intensity. A region of high intensity may be a region with an area of maximum intensity that is higher than the intensity of areas that surround the area of maximum intensity.

Referring again to FIG. 3A, the second surface 100*b* of the inorganic substrate 100 is on an opposite side of the inorganic substrate 100 from the first surface 100*a*. In some embodiments, the first surface 100*a* resides or substantially resides within a first plane 102*a* (illustrated in fine broken line in FIG. 3A), and the second surface 100*b* resides or substantially resides within a second plane 102*b* (illustrated in fine broken line in FIG. 3A). In some embodiments, the first surface 100*a* extends in any of multiple directions within the first plane 102*a*, although only a single extension direction 104*a* of the first surface 100*a* is shown, for example, in FIG. 3A. In some embodiments, the second surface 100*b* extends in any of multiple directions within the second plane 102*b*, although only a single extension direction 104*b* of the second surface 100*b* is shown, for example, in FIG. 3A. According to various embodiments, each of one or more or all of the various widths, diameters, and lateral cross-sections associated with vias, damage tracks, or pathways through inorganic substrate 110 discussed herein may, in some embodiments, be parallel to each of one or more or all of the planes 102*a*, 102*b*, and extension directions 104*a*, 104*b*. In some embodiments, each of the first surface 100*a* and the second surface 100*b* has a root mean square ("RMS") surface roughness less than 10 nm, according to some embodiments, and preferably less than 1 nm, according to some embodiments.

Figure 3B:
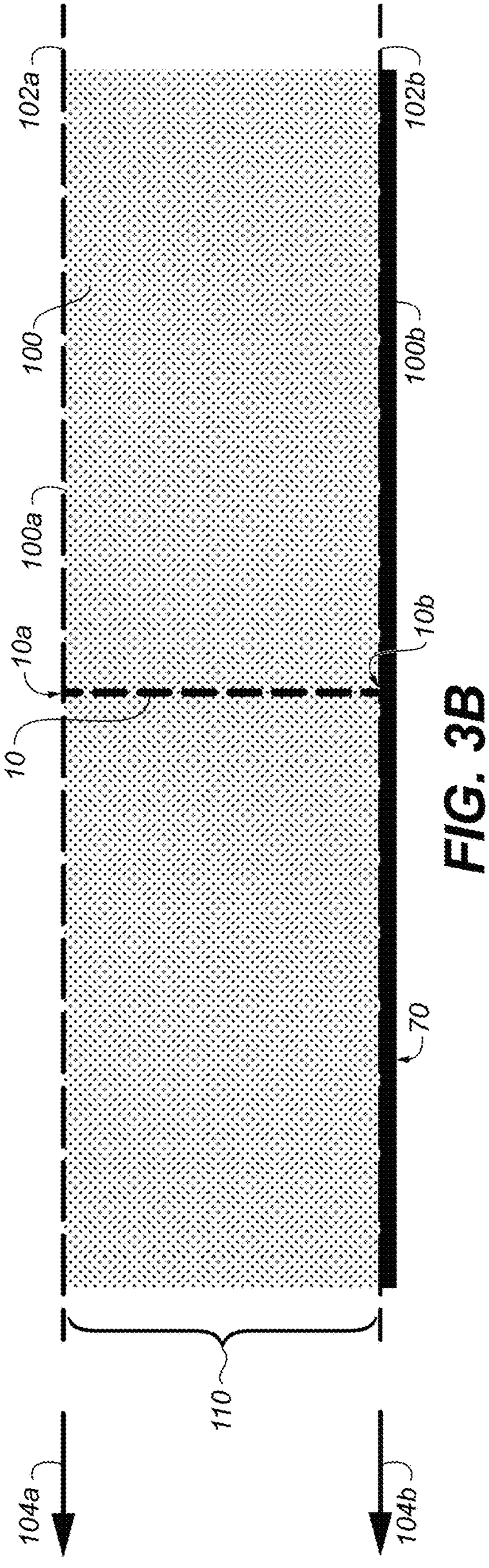

Referring to FIG. 3B and block 204 of FIG. 2, a mask layer set 70 is applied to surface 100*b* (e.g., "second surface" or "bottom surface" in some embodiments) of inorganic substrate 100, according to some embodiments. In some embodiments, block 204 pertains to covering the second surface 100*b* of the inorganic substrate 100 with the mask layer set 70. A mask layer set may include one or more mask layers, and may be inorganic, metallic, polymeric, or a combination. In some embodiments, a mask layer set may include several different layers acting together to keep wet etchant from etching surface 100*b* for example, during application of the single-sided wet etching process according to block 206 in FIG. 2.

Block 206 describes that a single-sided etching process ("SSEP") is applied to the first surface 100*a* of the inorganic substrate 100 while or in a first state in which second surface 100*b* of the inorganic substrate 100 is covered or protected (e.g., by mask layer set 70 in some embodiments). The SSEP may produce or increase the size of opening at one end of the damage track 10 and may form, or increase the internal diameter (taken perpendicular to the thickness 110) of a pathway or interim via along the damage track 10 in the inorganic substrate 100, according to some embodiments. In some embodiments, the SSEP enlarges at least a width (e.g., a maximum width or an average width in some embodiments) of at least the first end 10*a* of the damage track 10 to form a first opening 106*a* (e.g., FIG. 4A) in the first surface 100*a* of the inorganic substrate 100. In some embodiments, the SSEP produces a pathway 30 or interim via through the inorganic substrate 100 to surface 100*b* from the damage track 10. In some embodiments, the SSEP may include submerging the inorganic substrate 100 containing the damage track 10 and mask layer set 70 in a wet etch solution, which may be an acidic solution. In this regard, the SSEP may include or be an acidic wet etching process that etches the first surface 100*a* of the inorganic substrate 100 and is blocked by a mask layer set 70 from directly etching the second surface 100*b* of the inorganic substrate 100, at least until a path (e.g., pathway 30) for etchant is created through inorganic substrate 100 at the position of each damage track 10, according to some embodiments.

Figure 4A:
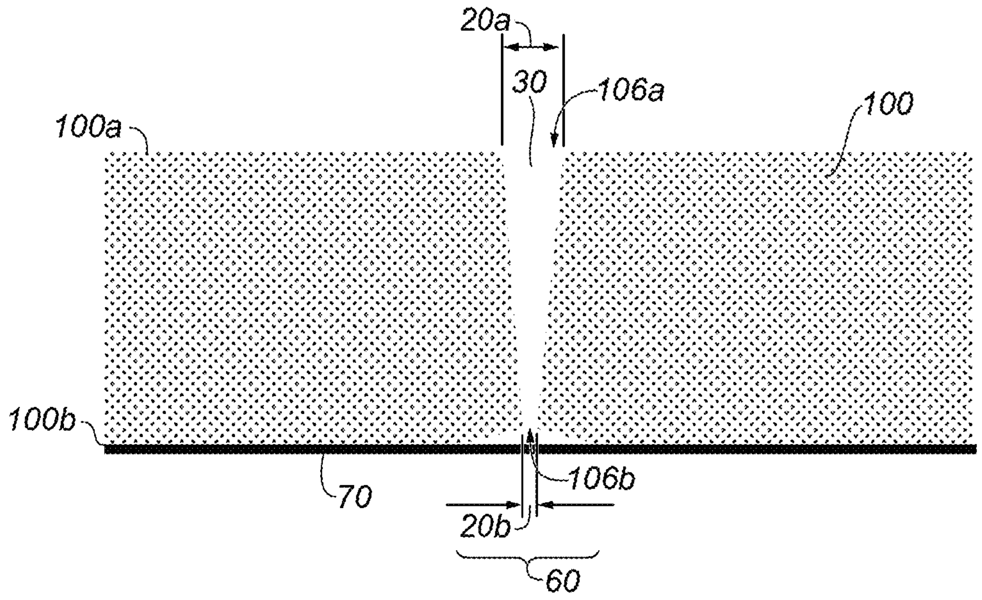
FIGS. 4A-4B illustrate an example of a first via-formation state of at least a portion of a substrate subjected to an improved single-sided wet etching process with reference to block 206 in FIG. 2, according to some embodiments of the present invention.
Figure 4B:
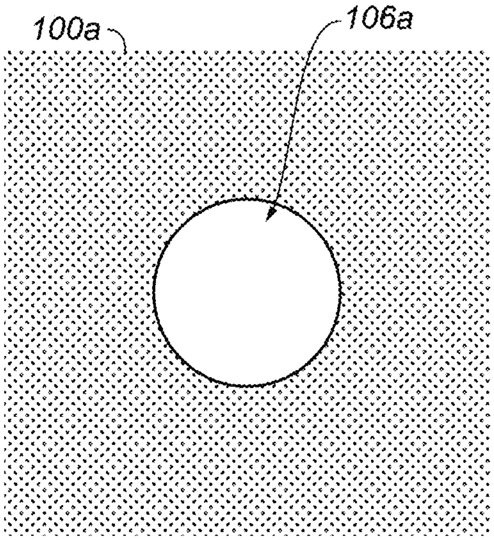

FIG. 4A illustrates an example of a first via-formation state of the inorganic substrate 100 subjected to the SSEP according to some embodiments of block 206 in FIG. 2. In some embodiments, the first via-formation state is an interim via-formation state at a time after completion of the SSEP according to block 206, but before application of the DSEP according to block 210, discussed in more detail below, according to some embodiments. In some embodiments, the wet etch of the SSEP is isotropic and causes, as illustrated by a comparison of FIGS. 3 and 4A, the diameter (e.g., the maximum diameter or average diameter in some embodiments) of an opening at one end of the damage track 10 to grow as the etch depth increases along the line of the damage track 10. In the first via-formation state of FIG. 4A, an opening 106*a* in the first surface 100*a* has grown compared to the state of FIG. 3, and the diameter 20*a* of the opening 106*a* indicated in FIG. 4A is greater than the diameter of the first end 10*a* of the damage track 10 shown in each of FIG. 3A and FIG. 3B. FIG. 4B illustrates a top-down view of the opening 106*a*, showing its circular shape, according to some embodiments. Although FIG. 4B illustrates a perfect circle for example purposes, it is to be understood that variations and imperfections would likely exist.

In FIG. 4A, an opening 106*b* in the second surface 100*b* of the inorganic substrate 100 has also formed due to application of the SSEP according to block 206. The opening 106*b* is illustrated with a diameter 20*b* that is smaller than the diameter 20*a* of opening 106*a* in first surface 100*a*. In some embodiments, once the wet etch solution opens damage track 10 enough to reach the interface between second surface 100*b* of the inorganic substrate 100 and the mask layer set 70, rapid etching along the interface may occur leading to undercutting. Referring to FIG. 4A, an undercut region 60 is shown, with height relatively exaggerated for clarity. In some embodiments, the interface between second surface 100*b* and the mask layer set 70 is not readily etched, and in that case no undercutting will occur and opening 106*b* will be located at the second surface 100*b* of the inorganic substrate 100. In some embodiments, the size of the undercutting will be controlled by choice of when to conclude the SSEP. In some embodiments, the SSEP is concluded when the diameter 20*a* of the opening 106*a* is smaller than the target final diameter (e.g., diameter 20*b*2 shown in FIG. 5A and discussed in more detail below, according to some embodiments) of the via.

Figure 5A:
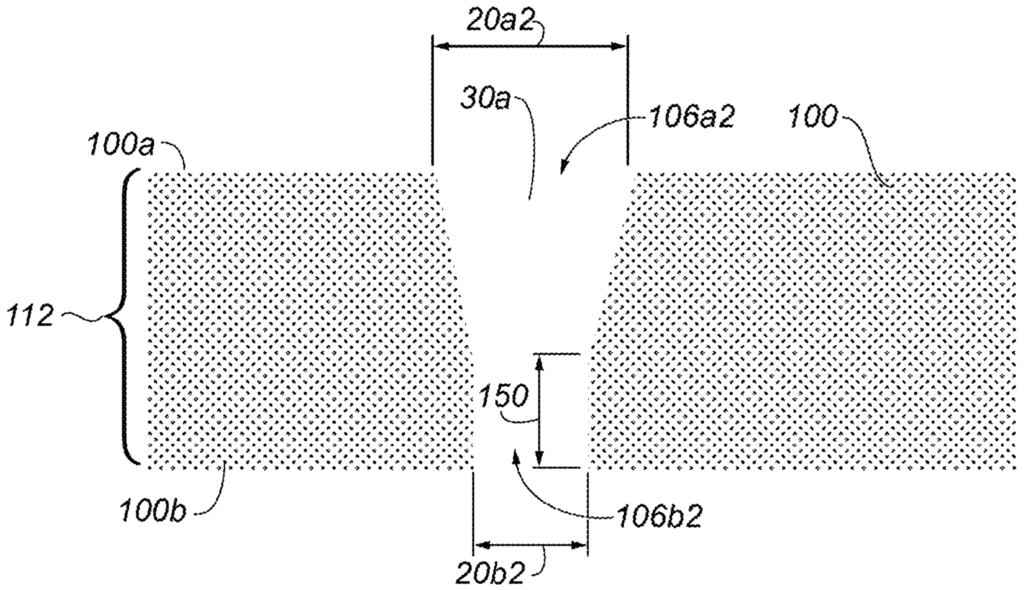
FIGS. 5A-5B illustrate an example of a via through at least a portion of a substrate subjected to an improved double-sided wet etching process after application of an improved single-sided wet etching process with reference to block 210 in FIG. 2, according to some embodiments of the present invention.

Referring back to FIG. 2, block 208 describes removing mask layer set 70 from the second surface 100*b* of the inorganic substrate 100 after completion of the SSEP described with reference to block 206, but before application of a double-sided wet etching process ("DSEP") to the inorganic substrate 100, as described in more detail below with respect to block 210. FIG. 5A illustrates an example of a via-formation state after application of the DSEP associated with block 210 to the inorganic substrate 100 when it is in the first state of FIG. 4A upon completion of the SSEP described with reference to block 206 in FIG. 2, according to some embodiments of the present invention. In some embodiments, block 210 is associated with applying the DSEP to the first surface 100*a* and the second surface 100*b* of the inorganic substrate 100 after completion of the SSEP associated with block 206 in a second state in which the inorganic substrate 100 has had the mask layer set 70 removed from the second surface 100*b* of the inorganic substrate 100.

In some embodiments, as at least part of the DSEP according to block 210, the substrate 100 is immersed in an etchant solution so that acidic etchants may attack both the first surface 100*a* and the second surface 100*b* simultaneously to produce a via (e.g., via 30*a* in FIG. 5A, in some embodiments). In this regard, in some embodiments, the DSEP may be a double-sided acidic wet etching process. In some embodiments, the resulting via (e.g., via 30*a* in FIG. 5A, in some embodiments) extends from the second opening (e.g., opening 106*a*2 in the case of via 30*a*, in some embodiments) in the first surface 100*a* of the inorganic substrate 100 to the opening (e.g., opening 106*b*2 in the case of via 30*a*, in some embodiments) in the second surface 100*b* of the inorganic substrate 100.

Following the DSEP, referring to an embodiment in FIG. 5A, the opening (also referred to as "second opening") 106*a*2 at or in the first surface 100*a* of inorganic substrate 100 has been etched to the preferred or final target diameter (e.g., maximum or average diameter in some embodiments) 20*a*2. In some embodiments, the DSEP enlarges at least a width (e.g., a maximum width or an average width in some embodiments) of the first opening 106*a* (e.g., FIG. 4A) in the first surface 100*a* of the inorganic substrate 100 to form or produce the second opening (e.g., at least second opening 106*a*2 in FIG. 5A) in the first surface 100*a* of the inorganic substrate 100. The DSEP has concurrently produced the diameter (e.g., maximum or average diameter in some embodiments) 20*b*2 of the opening 106*b*2 at or in second surface 100*b*. In some embodiments, the DSEP results in an opening 106*b*2 in the second surface 100*b* of the inorganic substrate 100. Depending on the duration of the SSEP according to block 206 and FIG. 2 (e.g., whether or not the single-sided etch proceeds all the way through the substrate 110), the opening 106*b*2 may be derived or produced from the second end 10*b* of the damage track 10 or from the opening 106*b*, according to various embodiments. A diameter or width (e.g., diameter 20*b*2 or a maximum or average diameter in some embodiments) of the opening 106*b*2 produced by the DSEP in the second surface 100*b* of the inorganic substrate 100 is less than a corresponding diameter or width (e.g., diameter 20*a*2 or a maximum or average diameter in some embodiments) of the second opening 106*a*2 produced by the DSEP in the first surface 100*a* of the inorganic substrate 100, according to some embodiments. In some embodiments, a ratio of (a) a diameter (e.g., a maximum or average diameter in some embodiments) of the second opening (e.g., at least opening 106*a*2) in the first surface 100*a* of the inorganic substrate 100 to (b) a diameter (e.g., a maximum or average diameter in some embodiments) of the opening (e.g., at least opening 106*b*2) in the second surface 100*b* of the inorganic substrate 100 is in a range of 40% to 95%, wherein the diameter of the second opening in the first surface of the inorganic substrate and the diameter of the opening in the second surface of the inorganic substrate are measured along parallel line segments (e.g., at least parallel line segments parallel to one or more or each of extension directions 104*a*, 104*b*, and planes 102*a*, 102*b*, according to some embodiments).

The result of the inventive DSEP following the inventive SSEP provides a conical frustum or trumpet shape to each via, according to some embodiments, wherein the diameter (e.g., a maximum diameter or an average diameter in some embodiments) of the via opening 106*b*2 at surface 100*b* closely resembles the diameter (e.g., a maximum diameter or an average diameter in some embodiments) of the via 30*a* for a distance 150 from the surface 100*b* towards surface 100*a*. Distance 150 in some embodiments may be in the range of 5% to 40% of the total substrate thickness 112 (e.g., FIG. 5A) after the DSEP. In this regard, the thickness 112 (e.g., FIG. 5A) may represent the thickness of the substrate 100 after the DSEP, whereas the thickness 110 (e.g., FIGS. 3A, 3B) may represent the thickness of the substrate 100 immediately before application of the SSEP.

In some embodiments, the DSEP continues far enough that all traces of any undercutting (such as undercut region 60 in FIG. 4A) are etched away, as shown in the embodiment in FIG. 5A. In some embodiments, the undercutting may continue beyond the diameter 20*b*2 of the via foot, and so an outer perimeter of the original undercut may persist after the DSEP. The undercut region 60 that optionally remains after the DSEP process may be referred to as a footer. If the diameter of undercut region 60 is larger than the opening 106*b*2, then a footer may exist in the via produced after the DSEP. The ratio of the diameter (e.g., a maximum diameter or an average diameter in some embodiments) of the undercut region 60 remaining after the DSEP to the diameter (e.g., a maximum diameter or an average diameter in some embodiments) 20*b*2 of opening 106*b*2 may be below 100%, meaning that the undercut region 60 is fully consumed by the DSEP resulting in no footer in the inorganic substrate 100 after the DSEP of block 210, according to some embodiments. Alternatively, in some embodiments, the ratio of the of the diameter (e.g., a maximum diameter or an average diameter in some embodiments) of the undercut region 60 to the diameter (e.g., a maximum diameter or an average diameter in some embodiments) 20*b*2 of opening 106*b*2 may be above 100%, meaning that a footer with a total diameter equivalent to the diameter of the undercut region 60 may be present in the substrate after the DSEP. The ratio of the diameter of the footer or undercut region 60 to the diameter 20*b*2 of opening 106*b*2 after the DSEP may be less than 150% in some embodiments, preferably less than 140%, in some embodiments. In this regard, in some embodiments, the DSEP results in the opening 106*b*2 in the second surface 100*b* of the inorganic substrate 100 having no footer or a footer having a width or diameter (e.g., a maximum width or diameter or an average width or diameter in some embodiments) less than 150%, in some embodiments, or less than 140%, in some embodiments, of the width or diameter (e.g., a maximum width or diameter or an average width or diameter in some embodiments) of the opening 106*b*2 in the second surface 100*b* of the inorganic substrate 100.

In some embodiments, the DSEP is continued until a taper develops from second surface 100*b* narrowing slightly towards the center of the thickness of the inorganic substrate 100. As illustrated, for example, in FIG. 5B, in at least some of such embodiments, the resulting hour-glass shaped via (e.g., via 30*a*1 in some embodiments) is asymmetrical (about a midpoint lateral-cross-section), with a larger opening 106*a*2*a* at first surface 100*a* than opening 106*b*2*b* at second surface 100*b*, with a waist developing (e.g., at lateral cross-section 31) closer to second surface 100*b* than to first surface 100*a*.

In some embodiments, the resulting shape of the via depends on a combination of the target final first surface 100*a* via diameter (e.g., diameter 20*a*2 in the case of FIG. 5A) and the thickness of the substrate 100. In some embodiments, the ratio of final first surface 100*a* via diameter to the thickness is known as the via aspect ratio. For example, with a via aspect ratio of 1:3, in some embodiments of the present invention, the final via shape may closely resemble the conical frustrum profile illustrated in FIG. 5A and the cross-sectional image of an actual sample having a 100 micrometer substrate thickness and via length in FIG. 6A. In other embodiments, for example, with an aspect ratio of 1:6, the final via shape may resemble the asymmetrical hourglass-like shape illustrated three dimensionally in FIG. 5B and in the image of an actual sample having a 175 micrometer substrate thickness and via length in FIG. 6B. Referring again to FIG. 5B, a longitudinal axis 32 of the via 30*a*1 (or via 30*a* by analogy in some embodiments) can be said to run through the substrate 100 where the damage track 10 was originally positioned, according to some embodiments. The longitudinal axis 32 may be perpendicular to (a) an extension direction (e.g., at least extension direction 104*a*) of the first surface 100*a* of the inorganic substrate 100, (b) an extension direction (e.g., at least extension direction 104*b*) of the second surface 100*b* of the inorganic substrate 100, or both (a) and (b). In this regard, in some embodiments, the longitudinal axis 32 may be perpendicular to (i) the first plane 102*a* in which the first surface 100*a* of the inorganic substrate 100 resides or substantially resides, (ii) the second plane 102*b* in which the second surface 100*b* of the inorganic substrate 100 resides or substantially resides, or both (i) and (ii). In some embodiments, the longitudinal axis 32 bisects a width of the via (e.g., via 30*a*1 or via 30*a*) at least at one or both of the openings of the via in the first surface 100*a* and second surface 100*b* of the inorganic substrate 100. In some embodiments, the longitudinal axis 32 proceeds through a center of a lateral cross section of either or both of the openings (e.g., openings 106*a*2, 106*b*2 in the example of FIG. 5A) in surfaces 100*a*, 100*b*, the lateral cross section(s) residing within the plane(s) (e.g., first plane 102*a*, second plane 102*b*, or both) of the respective opening(s). At different positions along the longitudinal axis 32 (e.g., which may be considered to be along a length of the via in some embodiments) within the via (e.g., via 30*a*1 or via 30*a* in some embodiments), the cross-sectional diameter of the via will vary, according to some embodiments. In this regard, the varying cross-sectional diameters of the via may be considered varying diameters of lateral cross-sections of the via, the lateral cross-sections (e.g., lateral cross-section 31 in FIG. 5B) taken perpendicular to the longitudinal axis 32 of the via, or taken parallel to the first plane 102*a*, the second plane 102*b*, or both the first plane 102*a* and the second plane 102*b*, or taken parallel to an extension direction (e.g., at least extension direction 104*a*) of the first surface 100*a* of the inorganic substrate 100, an extension direction (e.g., at least extension direction 104*b*) of the second surface 100*b* of the inorganic substrate 100, or both an extension direction (e.g., at least extension direction 104*a*) of the first surface 100*a* of the inorganic substrate 100 and an extension direction (e.g., at least extension direction 104*b*) of the second surface 100*b* of the inorganic substrate 100. In other words, the DSEP may produce a width (e.g., a maximum width or an average width in some embodiments) of the second opening (e.g., second opening 106*b*2 or second opening 106*b*2*b* in some embodiments) in the first surface 100*a* of the inorganic substrate, and the DSEP may result in a via (e.g., via 30*a* or via 30*a*1 in some embodiments) extending from the second opening (e.g., second opening 106*a*2 or second opening 106*a*2*a* in some embodiments) in the first surface 100*a* of the inorganic substrate 100 to the opening (e.g., opening 106*b*2 or opening 106*b*2*b* in some embodiments) in the second surface 100*b* of the inorganic substrate 100, the via having no waist or a waist or minimum diameter (e.g., a respective lateral cross-section having a minimum average diameter in some embodiments) along the longitudinal axis 32 within a range of 5%-40% in some embodiments, preferably within a range of 5% to 25% in some embodiments, of a thickness of the inorganic glass substrate from the second surface 100*b* of the inorganic substrate.

The waist, if present, may have a diameter (e.g., an average diameter or minimum diameter in some embodiments) smaller than the diameter (e.g., an average diameter or minimum diameter in some embodiments) of the second opening (e.g., second opening 106*a*2 or second opening 106*a*2*a* in some embodiments) in the first surface 100*a* of the inorganic substrate, the opening (e.g., opening 106*b*2*b* in some embodiments) in the second surface 100*b* of the inorganic substrate, or each of the second opening in the first surface 100*a* and the opening in the second surface 100*b*. While it may be preferable in some contexts for certain downstream operations such as via filling to have no waist or, if a waist exists, with a waist diameter as large as possible, excellent systems can function with a via waist with a width (e.g., a maximum width or an average width in some embodiments) of or within 75% to 100% of the width (e.g., a maximum width or an average width in some embodiments) of the opening (e.g., second opening 106*b*2 or second opening 106*b*2*b* in some embodiments) in the second surface 100*b* of the inorganic substrate. In some embodiments, it may be preferable to have a via waist (e.g., a maximum width or an average width in some embodiments) of or within 80% to 100% of the width (e.g., a maximum width or an average width in some embodiments) of the opening (e.g., second opening 106*b*2 or second opening 106*b*2*b* in some embodiments) in the second surface 100*b* of the inorganic substrate 100. A no waist via and both the 75% to 100% and the 80% to 100% ranges are achievable by various embodiments of the present invention.

Figure 5B:
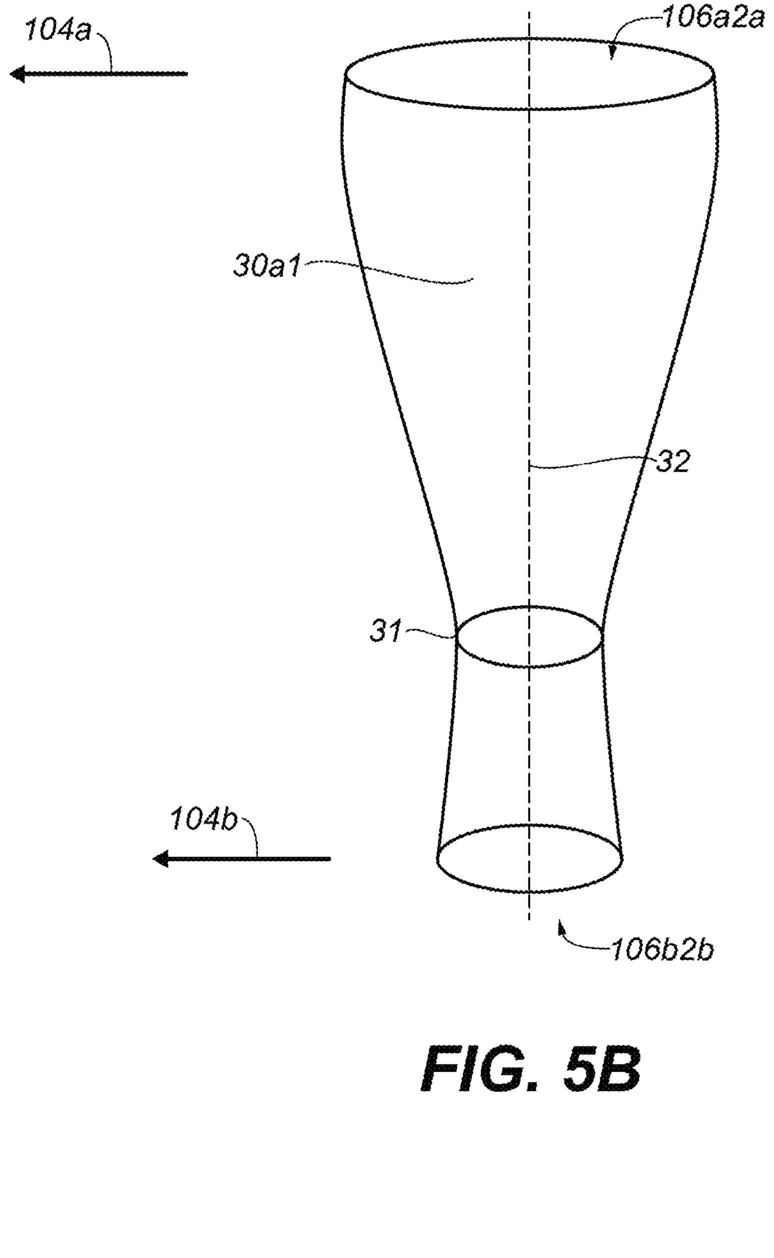
Figure 6A:
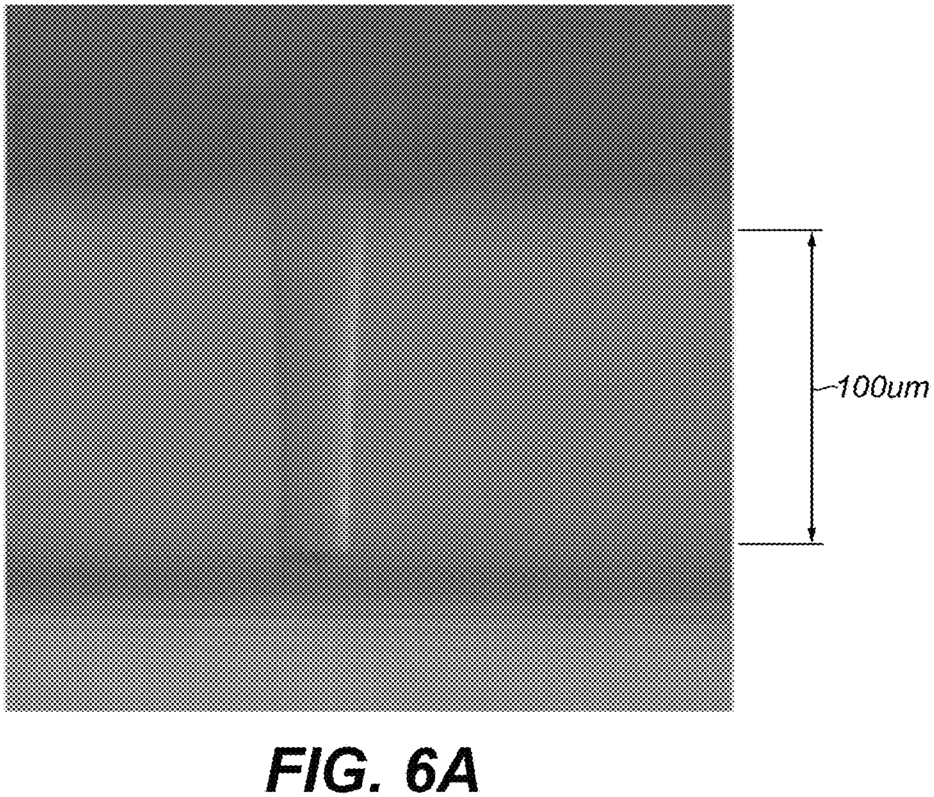
FIGS. 6A-6B show images of actual vias formed according to methods illustrated by FIG. 2, according to some embodiments of the present invention.
Figure 6B:
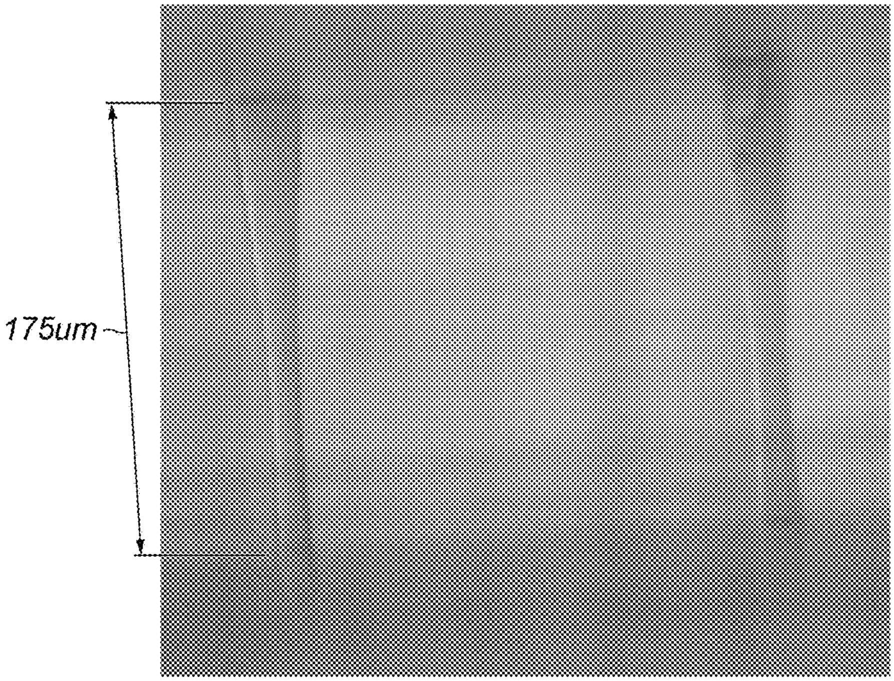

In some embodiments, the SSEP followed by the DSEP produces a via opening at each of surface 100*a* and surface 100*b* (e.g., opening 106*a*2 (FIG. 5A), opening 106*b*2 (FIG. 5A), opening 106*a*2*a* (FIG. 5B), opening 106*b*2*b* (FIG. 5B), according to some embodiments), and an internal via diameter that is smooth and without cracks, and circular or substantially circular in lateral cross-section, according to some embodiments, as shown, e.g., with at least FIG. 5B. According to some embodiments, circular means the various diameters of the respective opening (e.g., opening 106*a*2 (FIG. 5A), opening 106*b*2 (FIG. 5A), opening 106*a*2*a* (FIG. 5B), opening 106*b*2*b* (FIG. 5B), and also opening 106*a* (FIG. 4A), opening 106*b* (FIG. 4A), according to some embodiments) or a lateral cross-section of an internal region of the via or pathway (such as at least a waist thereof) measure substantially the same value regardless of the orientation of the diameter measurement in the respective plane (e.g., plane 102*a* in the case of the openings at surface 100*a*, plane 102*b* in the case of the openings at surface 100*b*, or within the plane of the respective lateral-cross section of an internal portion of the via or pathway), according to some embodiments. The circularity of each opening or lateral cross-section of the via or pathway 30 may be characterized by the ratio of the minimum diameter to the maximum diameter of the opening or lateral cross-section as measured in a large number of possible diameter-measurement orientations. A circularity of greater than 0.8 is preferred and achievable by various embodiments of the present invention, according to some embodiments. Alternatively, openings or lateral cross-sections in vias or pathways that are intentionally non-circular, with a circularity below 0.8, may be useful for certain applications and is achievable by various embodiments of the present invention. Typical sizes of the diameter of an opening in a via or pathway are less than or equal to 50 micrometers, and more preferably less than or equal to 30 micrometers, according to various embodiments. In some cases, smaller internal lateral cross-sectional diameters of vias or pathways are preferred and achievable, with via diameter less than or equal to 10 micrometers, according to some embodiments.

In some embodiments, it may be advantageous to apply the SSEP and DSEP to thin substrates. When glass substrates are formed sufficiently thin, less than 0.3 mm for example, it can be difficult to handle free-standing, for instance, for processes following the DSEP, that are intended to fill the through-glass vias with electrically conductive material. For some cases, mounting or bonding the thin glass on a handle wafer or substrate, also referred to as a carrier wafer or substrate, can be advantageous, and in some cases smooth surfaces (root mean square roughness less than 5 nanometers) are advantaged for bonding a carrier wafer. The handle or carrier wafer may be any substrate that can be mounted or bonded to a thin substrate, although in some embodiments, the handle or carrier wafer should have mechanical and thermal properties compatible with glass substrates.

In some embodiments, the handle substrate is an inorganic substrate. The inorganic substrate may be any inorganic material useful for semiconductor, photonic, electronic, or photonic packaging, according to some embodiments. Inorganic handle substrates may include, but are not limited to, glass, fused silica, synthetic quartz, glass ceramic, ceramic, aluminum oxides, crystalline material, such as sapphire, or laminated layers of such materials (for example, coated glass). Silicon dioxide ($SiO_2$)-based materials may be particularly suitable for a handle substrate in some embodiments. $SiO_2$ may be pure, commonly referred to as fused silica or fused quartz, or may contain one or more other components including but not limited to Al, Ca, B, Mg, or a combination thereof, according to some embodiments. $SiO_2$ containing other components may be known as multicomponent glass. In some embodiments, the handle or carrier wafer or substrate may be a semiconductor available in wafer form. In some embodiments, the handle or carrier wafer may be silicon. In some embodiments, the handle or carrier wafer or substrate is an inorganic substrate such as glass. In some embodiments, such a glass handle substrate may be pure silicon dioxide, such as fused silica, or may be a multicomponent glass containing or including silicon dioxide and other elements.

According to some embodiments, a bonding to a carrier process may be performed by any method which brings the substrates to be bonded in contact and with suitable alignment. The process may include application of pressure or elevated temperatures. In some embodiments, it may be preferable that the surfaces of the substrates to be bonded be smooth enough so that the bond forms spontaneously, or progresses spontaneously after application of a point of contact between the two substrates by localized pressure.

In some embodiments, it may be preferable to apply a surface-modifying layer on a handle wafer, which creates a fluid-resistant yet temporary bond between the substrate 100 and the handle substrate. In some embodiments, according to block 212 in FIG. 2, the second surface 100*b* of the inorganic substrate 100 is temporarily bonded to a handle or carrier substrate after completion of the DSEP using a deposited carbonaceous layer.

Appropriate carbonaceous surface modification layers allow a higher adhesion force between the second surface 100*b* and the handle or carrier substrate than simple Van der Waals interactions between the clean surfaces, yet remain temporary even after anneals to 400° C. Carbonaceous surface modification layers may include one or more layers or films which contain carbon as a significant component. The carbon may exist in the form of polymeric chains exhibiting finite molecular weight. Alternatively, the carbon may exist as a matrix of carbon atoms bonded to form an amorphous or crystalline solid film. The carbon may exhibit $sp^2$ bonding or $sp^3$ bonding, also referred to as $sp^2$ or $sp^3$ orbital hybridization. The carbonaceous surface modification layers may contain substantial quantities of other atoms. Preferred additional atoms may include hydrogen and fluorine, at concentrations below 50 atomic % relative to the entire film, or preferably below 40 atomic % relative to the entire film, according to various embodiments. Preferred carbonaceous surface modification layers may be amorphous carbon, amorphous hydrogenated carbon, diamond, diamond-like carbon, and fluorine containing carbon films, according to various embodiments. The carbonaceous surface modification layers may be deposited by any suitable deposition technique, according to some embodiments. Preferred deposition techniques may include vacuum deposition, preferably plasma enhanced chemical vapor deposition (PECVD), according to various embodiments. A particularly preferred deposition technique may be PECVD in the presence of a voltage-floating platen as used in reactive ion etch (ME) systems, according to some embodiments. The carbonaceous surface modification layers may be of any desired thickness. Layer thickness below 100 nm may be preferred, according to some embodiments, and a particularly preferred layer thickness may be below 50 nm, according to some embodiments. The carbonaceous surface modification layers may include an exposed surface with very low roughness. The roughness of the surface may be below 10 nm, preferably below 1 nm in RMS roughness, according to some embodiments. The carbonaceous surface modification layers may be applied to either or both surfaces that are to be bonded. In a non-limiting example, the carbonaceous surface modification layers may be applied either to the surface of the glass substrate or to the surface of a silicon substrate that are to be bonded, or to both of the surfaces to be bonded. The surfaces to be bonded are the two surfaces from different substrates that are contacted during bonding, as opposed the two opposing surfaces of single substrate, according to some embodiments.

The bonding or bonding type between the inorganic substrate 100 and the handle substrate may be of any type that permits the two substrates to remain in adhesion during all envisioned processing steps. A preferred method of bonding may be Van der Waals bonding, in which the substrates are held together due to Van der Waals forces resulting from atomic constituents present on the two surfaces (e.g., surface 100*b* of the inorganic substrate 100 and the surface of the carrier substrate) being bonded. Van der Waals forces may result in bonded substrates with bond energies ranging from 20 to 300 mJ/m 2 as measured by a razor insertion technique (see, e.g., Gillis, Peter P., et al., "Double-Cantilever Cleavage Mode of Crack Propagation", Journal of Applied Physics 35, 647 (1964)). Van der Waals bonds may be modified by treating surfaces to be bonded with processes including, but not limited to, cleaning, acid exposure, base exposure, plasma treatments, and ozone treatments, according to various embodiments. The bonding or bonding type may also include some number of covalent bonds that form at room temperature or above and serve to covalently connect moieties on the two respective surfaces. In this regard, in some embodiments, the bonding of the second surface 100*b* of the inorganic substrate 100 to the carrier substrate according to block 206 in FIG. 2 may be Van der Waals bonding or Van der Waals bonding assisted by covalent bonding. Van der Waals bonding assisted by a covalent bonding may be particularly preferred in some contexts since Van der Waals bonds alone may not be sufficient to hold the substrates in contact with each other during all anticipated wet processing. Typical covalent bonds may include siloxane bonds (—Si—O—Si—), and silicon bonds to any number of carbon-based groups that exist on the carbonaceous surface modification layers, according to various embodiments. Covalent bonds can be relatively strong, leading to bond energies of greater than 2000 mJ/m$^2$, resulting in bonds that are relatively difficult to debond in some contexts. Such a strong bond may be preferred in some situations where it is desired to leave the carrier permanently bonded to the inorganic substrate 100. In other situations, it may be desirable to debond or remove the carrier. In at least some of these cases, it may be preferable that the bond energy composed of Van der Waals forces and covalent boding forces, be less than 1,000 mJ/m$^2$, preferably less than 800 mJ/m$^2$, according to various embodiments. After bonding, bonds may be modified or undergo any number of processes including annealing, compression, and wet treatments, according to some embodiments. Annealing may be at any suitable temperature, time, and environment, preferably at or below 400° C. and in an inert gaseous or vacuum environment, according to some embodiments.

Typically, in order to use any thin, non-compliant adhesion layer, such as a carbonaceous surface modification layer for bonding, the surfaces to be bonded may need to be clean and smooth, with RMS roughness below 10 nm, according to some embodiments. Prime silicon wafers typically have adequate cleanliness and smoothness as delivered commercially. In some embodiments, a silicon wafer is preferred as the carrier, because in addition to the smooth, bondable surface, a silicon semiconductor wafer can provide structural rigidity for easier handling.

For the inorganic substrate 100, the starting roughness, details of the SSEP and DSEP etchant solution composition, conditions of the etch bath including agitation and temperature, and time in the solution determine the roughness of the substrate surfaces after the etches, according to some embodiments. The roughness may be dramatically increased, essentially maintained, or in some cases decreased after the either the SSEP or the DSEP. In some embodiments, care should be taken to maintain a surface roughness of less than 2 nm after the DSEP, more preferably below 0.6 nm RMS in some contexts. Because second surface 100*b* is protected through the SSEP, no increase in surface roughness occurs on second surface 100*b*, according to some embodiments. The second surface 100*b*, which is the surface preferred for bonding in some embodiments, is only exposed during the DSEP, which in some embodiments is a shorter etch than the SSEP.

In light of the above-discussion, according to some embodiments, a method of facilitating formation of a via in an inorganic substrate may include (e.g., according to block 206 in FIG. 2), applying the SSEP to at least a first surface (e.g., first surface 100*a*) of the inorganic substrate (e.g., inorganic substrate 100), the inorganic substrate including a damage track (e.g., damage track 10) having a first end (e.g., first end 10*a*) in the first surface of the inorganic substrate and a second end (e.g., second end 10*b*) in a second surface (e.g., second surface 100*b*) of the inorganic substrate. The second surface may be on an opposite side of the inorganic substrate than the first surface of the inorganic substrate. The SSEP may enlarge at least a first dimension (e.g., a size, width, diameter, or area of lateral cross-section, according to various embodiments) of the first end of the damage track to form a first opening (e.g., first opening 106*a*) in the first surface of the inorganic substrate. The first dimension of the first end of the damage track may be measured within a plane (e.g., plane 102*a*) of the first surface of the inorganic substrate. The SSEP may, if continued long enough, enlarge at least a first dimension (e.g., a size, width, diameter, or area of lateral cross-section, according to various embodiments) of the second end of the damage track to form a first opening (e.g., first opening 106*b*, in some embodiments) in the second surface of the inorganic substrate. The first dimension of the second end of the damage track may be measured within a plane (e.g., plane 102*b*) of the second surface of the inorganic substrate. The SSEP may produce a via or pathway (e.g., pathway or interim via 30) extending between the first opening in the first surface of the inorganic substrate and the first opening in the second surface of the inorganic substrate. The via or pathway (e.g., pathway or interim via 30) may include a longitudinal axis (e.g., akin to longitudinal axis 32 shown in FIG. 5B) perpendicular to (a) an extension direction (e.g., extension direction 104*a*) of the first surface of the inorganic substrate, (b) an extension direction (e.g., extension direction 104*b*) of the second surface of the inorganic substrate, or both (a) and (b). The via or pathway (e.g., pathway or interim via 30) may include varying diameters of lateral cross-sections (e.g., akin to cross-section 31 shown in FIG. 5B) taken perpendicular to the longitudinal axis of the via or pathway, according to some embodiments. In some embodiments, the pathway after the SSEP will include diameters of lateral cross-sections that steadily decrease with longitudinal distance from surface 100*a* at least until a footer is reached, if such footer exists.

According to various embodiments, the SSEP may be any process that etches or removes portions of the inorganic substrate (e.g., inorganic substrate 100) preferentially in the location of the damage track(s) (e.g., damage track 10) so as to enlarge the respective damage track(s) to form a partial or fully formed via (e.g., akin to FIG. 4A, depending on desired via shaping, according to some embodiments). The SSEP may include etching with reactive gases and immersive wet processes involving acidic solutions. Immersive wet processes may be preferred in various contexts. In this regard, the SSEP may be a single-sided acidic wet etching process, according to some embodiments. An immersive single-sided etching process performed in a tank may be particularly suitable in various contexts. The immersive wet process may also include agitation of the solution in the tank. Agitation may include fluid flow, gas flow, application of ultrasonic energy in the range of 30 kHz to approximately 1 MHz, or application of so called megasonic mixing involving the application of frequencies near and above 1 MHz. Etching may be accomplished with acidic solutions. For many materials, including $SiO_2$-containing materials, solutions containing hydrogen fluoride (HF) may be preferable. Solution compositions including HF at concentrations from 0.1 to 10M may be preferable, according to some embodiments, and may include additional components to lower or raise pH. The additional components may include, but are not limited to, hydrochloric acid, nitric acid, and ammonium fluoride, according to various embodiments. Additional components may include surfactants. Temperature of the tank may be as cold as −10° C. or up to 60° C., with a range between 0° C. and 50° C. being preferable in some contexts.

Multicomponent glasses such as borosilicate or aluminoborosilicate glass contain components such as calcium and magnesium that tend to precipitate upon etching with HF.

This precipitation may lead to non-uniform etch and fouling of the etching vessels. Certain etchant formulations prevent significant precipitation, generally by providing lower hydrofluoric concentration and higher concentrations of a strong acid. A strong acid may be any acid with an acid dissociation constant, pKa, of less than 2, preferably less than 1 in some contexts, including but not limited to hydrochloric, nitric, or sulfuric acid. Preferred etching solutions (e.g., for the SSEP according to block 206, for the DSEP according to block 210, or for each of the SSEP and the DSEP) may contain an HF concentration less than a value between 0.1 and 1M and a strong acid concentration greater than 0.8M and less than 10M in some embodiments, preferably greater than 0.8M and less than 5M in some embodiments. Particularly preferred etching compositions may contain an HF concentration below 0.6M and a strong acid concentration above 1M, according to some embodiments.

In some embodiments, the SSEP need not produce a complete via opening that progresses all the way through the inorganic substrate (e.g., inorganic substrate 100). In some embodiments where the SSEP does not progress all the way through, it may be considered that a pathway extends from or between the opening 106*a* (an example of a first opening in the first surface 100*a* of the inorganic substrate 100 in this example) to the end of the damage track 10 on the second surface 100*b*, such that the pathway includes the remaining portion of the damage track 10 that has undergone substantially no etching. In at least some of these instances, the progression of the complete via opening through the entirety of the inorganic substrate 100 may be completed by the DSEP according to block 210 in FIG. 2, according to some embodiments.

In some embodiments where the SSEP completes the via-formation state of FIG. 4A, for example, the SSEP according to block 206 enlarges at least a first dimension of at least a first end 10*a*) or first end portion of the damage track 10 extending from the first surface 100*a* of the inorganic substrate 100 to form a first opening (e.g., first opening 106*a* in this example) in the first surface 100*a* of the inorganic substrate 100. As the enlargement of the opening increases, the depth of the opening moves closer to the second surface 100*b* of the inorganic substrate 100 along damage track 10. Referring to FIG. 4A, as the single-side etching process continues, if desired, the opening region eventually reaches the interface between the second surface 100*b* and the mask layer set 70, causing the via or pathway 30 to include an open channel extending all the way through the inorganic substrate 100, and enlarging at least a first dimension of the second end 10*b* of the damage track 10.

Before applying the SSEP according to block 206, the second surface 100*b* of the inorganic substrate 100 may be protected, sealed, or blocked by mask layer set 70, in preparation for application of the SSEP. In this regard, according to block 204, second surface 100*b* may be masked, protected, sealed, or blocked by applying mask layer set 70 to the second surface 100*b*. The mask layer set 70 may include or be an etch-resistant material.

In some embodiments, the mask layer set 70 may include or be a polymeric etch resistant material, or an adhesive etch-resistant film on second surface 100*b*. The mask layer set 70 may also be applied by deposition of appropriate metallic films, which can be selectively etched off after the SSEP. The metallic films may be deposited by any suitable means, including liquid deposition and vapor deposition. Vapor deposition may include but not be limited to vacuum deposition, sputtering, evaporation, or chemical vapor deposition. The metallic film may include or be any metal that is resistant to HF, including but not limited to chromium, titanium, tungsten, ruthenium, and tantalum. The mask layer set 70 may also be applied by deposition of appropriate one or more insulating or semiconducting films, which can be selectively etched off after the SSEP. The one or more insulating or semiconducting films may be deposited by any suitable means, including liquid deposition and vapor deposition. Vapor deposition may include but not be limited to vacuum deposition, sputtering, evaporation, or chemical vapor deposition. The one or more insulating or semiconducting films may be any material that is sufficiently resistant to HF, including but not limited silicon dioxide, silicon (amorphous or crystalline), carbonaceous layers, and silicon nitride. The mask layer set 70 may also include or be a temporarily bonded carrier, preferably an etch-resistant carrier or blocking substrate, according to some embodiments. In some embodiments, the mask layer set may include or be combinations of blocking layers (e.g., polymeric films and blocking substrates, or metallic films and adhesive etch-resistant films, or insulating or semiconducting films and adhesive etch-resistant films).

After the second surface 100*b* of the inorganic substrate 100 is sealed, protected, or blocked by mask layer set 70 to prevent or at least significantly reduce access of wet etch material according to some embodiments associated with block 204 in FIG. 2, the SSEP noted in FIG. 2, block 206 may be undertaken, according to some embodiments. According to various embodiments, the SSEP may be a wet-etch process. The SSEP enlarges the size of at least part of the damage track 10 from the accessible first surface 100*a* side of the inorganic substrate 100, and progressively moves the opening of the via or pathway 30 toward the sealed second surface 100*b*, according to some embodiments, as illustrated by a comparison of, e.g., at least FIG. 3B and FIG. 4A. Setting of etch conditions and properties for the SSEP can be important to control the type of etching that ensues.

In some embodiments, one advantage of applying the SSEP according to block 206 in FIG. 2 followed by the DSEP according to block 210 in FIG. 2 is that the size and shape and other dimensions and characteristics of the vias or pathways may be controlled by the timing and other characteristics of the two sets of etches. In some embodiments, a longer SSEP might be chosen, to keep the surface roughness of second surface 100*b* as close to original as possible, by minimizing the time it is exposed to the DSEP. In some embodiments, a final configuration with no trace of undercut is preferred, and the SSEP etch may consequently be chosen to be shorter, and the DSEP longer. The trade-offs between the SSEP and the DSEP allow the ultimate shape of the via to be tuned, and, in some embodiments, the ratio between the diameter of the via opening in the first surface 100*a* to the diameter of the via opening in the second surface 100*b* to be closer to one than can be achieved in a conventional solely-single sided etch. This allows the inventive vias to have relatively smaller openings at the first surface for a given average via diameter, and thus allows increased via densities relative to the conventional etches.

Another advantage of applying the SSEP according to block 206 in FIG. 2 followed by the DSEP according to block 210 in FIG. 2 is that the resulting shape of the via lends itself to ready filling with electrically conductive material in subsequent processes. A via profile that does not contain a re-entrant portion may be preferred for single-side via filling. At first glance, it might appear that superimposing an etching process that tends to create an hour-glass via profile (such as would result from a DSEP alone) onto a conical profile (resulting from the SSEP) would not create a useful profile without reentrance. However, in some embodiments, by careful choice for the etching conditions, it is possible, according to various embodiments of the present invention, to produce a via profile without significant reentrance as can be seen in the cross-sectional image of an actual sample in at least FIG. 6A.

Subsets or combinations of various embodiments described above provide further embodiments. These and other changes can be made to the invention in light of the above-detailed description and still fall within the scope of the present invention. In general, in the following claims, the terms used should not be construed to limit the invention to the specific embodiments disclosed in the specification. Accordingly, the invention is not limited by the disclosure, but instead its scope is to be determined entirely by the following claims.

What is claimed is:

1. A method of facilitating formation of a via in an inorganic substrate, the method comprising:

applying a single-sided acidic wet etching process to a first surface of the inorganic substrate in a first state in which the inorganic substrate has a mask layer set covering a second surface of the inorganic substrate, the inorganic substrate comprising a damage track having a first end in the first surface of the inorganic substrate and a second end in the second surface of the inorganic substrate, the second surface on an opposite side of the inorganic substrate than the first surface of the inorganic substrate, and the single-sided acidic wet etching process enlarging at least a maximum width of the first end of the damage track to form a first opening in the first surface of the inorganic substrate, and the single-sided acidic wet etching process enlarging at least a maximum width of the second end of the damage track to form a first opening in the second surface of the inorganic substrate, thereby forming a pathway or interim via extending through the inorganic substrate from the first opening in the first surface of the inorganic substrate to the first opening in the second surface of the inorganic substrate; and applying a double-sided acidic wet etching process to the first surface and the second surface of the inorganic substrate after completion of the single-sided acidic wet etching process and in a second state in which the inorganic substrate has had the mask layer set removed from the second surface of the inorganic substrate, the double-sided acidic wet etching process enlarging at least a maximum width of the first opening in the first surface of the inorganic substrate to form a second opening in the first surface of the inorganic substrate, the double-sided acidic wet etching process enlarging at least a maximum width of the first opening in the second surface of the inorganic substrate to form an opening in the second surface of the inorganic substrate, the opening in the second surface of the inorganic substrate having a maximum width that is less than a maximum width of the second opening in the first surface of the inorganic substrate, and the double-sided acidic wet etching process resulting in a via extending from the second opening in the first surface of the inorganic substrate to the opening in the second surface of the inorganic substrate, the via having no waist or a waist within a range of 5% to 40% of a thickness of the inorganic substrate from the second surface of the inorganic substrate.

2. The method of claim 1, wherein each of the single-sided acidic wet etching process and the double-sided acidic wet etching process includes application of an etching composition comprising hydrogen fluoride ("HF").

3. The method of claim 1, wherein the inorganic substrate is a multicomponent glass substrate.

4. The method of claim 3, wherein each of the single-sided acidic wet etching process and the double-sided acidic wet etching process includes application of an etching composition comprising a hydrogen fluoride ("HF") concentration less than 1M and a strong acid concentration greater than 0.8M.

5. The method of claim 1, wherein the inorganic substrate is fused silica.

6. The method of claim 1, wherein the via comprises the waist within 5% to 40% of the thickness of the inorganic substrate from the second surface of the inorganic substrate, and wherein the waist of the via has a width within 75% to 100% of the maximum width of the opening in the second surface of the inorganic substrate.

7. The method of claim 1, comprising bonding a handle substrate to the second surface of the inorganic substrate after completion of the double-sided acidic wet etching process.

8. The method of claim 7, wherein the handle substrate is silicon.

9. The method of claim 1, wherein the via has a conical frustum shape.

10. The method of claim 1, wherein the damage track was formed by a laser.

11. The method of claim 1, wherein a ratio of (a) a diameter of the second opening in the first surface of the inorganic substrate to (b) a diameter of the opening in the second surface of the inorganic substrate is in a range of 40% to 95%, and wherein the diameter of the second opening in the first surface of the inorganic substrate and the diameter of the opening in the second surface of the inorganic substrate are measured along parallel line segments.

12. The method of claim 1, wherein, prior to applying the single-sided acidic wet etching process, a thickness of the inorganic substrate is between 300 micrometers and 10 micrometers.

13. The method of claim 1, wherein, after completion of the single-sided acidic wet etching process and prior to applying the double-sided acidic wet etching process, a thickness of the inorganic substrate is between 300 micrometers and 10 micrometers.

14. The method of claim 1, wherein the double-sided acidic wet etching process results in the opening in the second surface of the inorganic substrate having no footer or a footer comprising an undercut region having a maximum width less than 140% of the maximum width of the opening in the second surface of the inorganic substrate.

15. The method of claim 1, wherein the via comprises the waist, and wherein the waist comprises a minimum width of the via at a lateral cross-section between the second opening in the first surface of the inorganic substrate and the opening in the second surface of the inorganic substrate, the minimum width within the range of 5% to 40% of the thickness of the inorganic substrate from the second surface of the inorganic substrate.

16. The method of claim 1, wherein the via comprises the waist, and wherein the waist comprises a minimum width of the via at a lateral cross-section between the second opening in the first surface of the inorganic substrate and the opening in the second surface of the inorganic substrate, the minimum width within a range of 5% to 25% of the thickness of the inorganic substrate from the second surface of the inorganic substrate.

* * * * *